(12) United States Patent
Uemichi

(10) Patent No.: US 12,255,597 B2
(45) Date of Patent: Mar. 18, 2025

(54) DIGITAL PHASE SHIFT CIRCUIT AND DIGITAL PHASE SHIFTER

(71) Applicant: Fujikura Ltd., Tokyo (JP)

(72) Inventor: Yusuke Uemichi, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 18/262,618

(22) PCT Filed: Dec. 27, 2022

(86) PCT No.: PCT/JP2022/048278
§ 371 (c)(1),
(2) Date: Jul. 24, 2023

(87) PCT Pub. No.: WO2023/188654
PCT Pub. Date: Oct. 5, 2023

(65) Prior Publication Data
US 2024/0429897 A1    Dec. 26, 2024

(30) Foreign Application Priority Data
Mar. 28, 2022  (JP) ................................ 2022-052038

(51) Int. Cl.
*H03H 11/16*    (2006.01)
(52) U.S. Cl.
CPC .................. *H03H 11/16* (2013.01)
(58) Field of Classification Search
CPC ........ H03H 11/16; H03H 11/18; H03H 11/20; H03H 17/08; H03K 5/131; H03K 5/133; H03K 2005/00286; H03K 2005/00293

USPC ................. 327/231, 564, 565, 566
See application file for complete search history.

(56) References Cited

U.S. PATENT DOCUMENTS

| | | | |
|---|---|---|---|
| 12,015,387 B2* | 6/2024 | Uemichi | ................ H01P 1/185 |
| 12,052,007 B1* | 7/2024 | Uemichi | ................ H01P 1/184 |
| 2019/0157754 A1 | 5/2019 | Valdes Garcia et al. | |

(Continued)

FOREIGN PATENT DOCUMENTS

| | | |
|---|---|---|
| JP | 2001-044717 A | 2/2001 |
| JP | 7072118 B1 | 5/2022 |

(Continued)

OTHER PUBLICATIONS

Y. Tousi et al., "A Ka-band Digitally-Controlled Phase Shifter with sub-degree Phase Precision", RTU2C-5, 2016 IEEE; Cited in the Specification. (4 pages).

(Continued)

*Primary Examiner* — Hai L Nguyen
(74) *Attorney, Agent, or Firm* — WHDA, LLP

(57) ABSTRACT

A digital phase shift circuit includes: a basic phase shift circuit including a signal line, a pair of inner lines provided on both sides of the signal line, a pair of outer lines provided outside of the inner lines, a first grounding conductor connected to one ends of the pair of inner lines and the pair of outer lines, a second grounding conductor connected to the other ends of the pair of outer lines, and a pair of electronic switches provided between the other ends of the pair of inner lines and the second grounding conductor; and an output circuit configured to decrease an output load of the basic phase shift circuit in comparison with an input load thereof.

13 Claims, 5 Drawing Sheets

(56) References Cited

U.S. PATENT DOCUMENTS

2019/0158068 A1   5/2019   Valdes Garcia et al.
2021/0082840 A1   3/2021   Kanj et al.

FOREIGN PATENT DOCUMENTS

JP      7076662 B1    5/2022
JP      7076663 B1    5/2022

OTHER PUBLICATIONS

International Search Report dated Feb. 21, 2023, issued in counterpart Application No. PCT/JP2022/048278. (2 pages).
Yishay Roee Ben et al., "PVT Robust Passive Phase Shifter for 5G MIMO Applications", 2020 IEEE 20th Topical Meeting on Silicon Monolithic Integrated Circuits in RF Systems (SIRF), IEEE, Jan. 26, 2020 (Jan. 26, 2020), pp. 13-15; cited in Extended European Search Report dated Jun. 26, 2024.

* cited by examiner

DIGITAL PHASE SHIFT CIRCUIT AND DIGITAL PHASE SHIFTER

TECHNICAL FIELD

The present invention relates to a digital phase shift circuit and a digital phase shifter.

Priority is claimed on Japanese Patent Application No. 2022-052038, filed Mar. 28, 2022, the content of which is incorporated herein by reference.

BACKGROUND ART

A digitally controlled phase shift circuit (a digital phase shift circuit) for microwaves, submillimeter waves, or millimeter waves is disclosed in Non-Patent Document 1. As illustrated in FIG. 2 of Non-Patent Document 1, the digital phase shift circuit includes a signal line, a pair of inner lines that are provided on both sides of the signal line, a pair of outer lines that are provided outside of the pair of inner lines, a first grounding bar that is connected to one end of each of the pair of inner lines and the pair of outer lines, a second grounding bar that is connected to the other end of each of the pair of outer lines, and a pair of NMOS switches that are respectively provided between the other ends of the pair of inner lines and the second grounding bar.

The digital phase shift circuit switches an operation mode between a low-delay mode and a high-delay mode by switching a return current flowing in the pair of inner lines or the pair of outer lines due to transmission of signal waves in the signal line according to turning-on/off of the pair of NMOS switches. That is, the operation mode of the digital phase shift circuit is switched to the low-delay mode when a return current flows in the pair of inner lines, and the operation mode is switched to the high-delay mode when a return current flows in the pair of outer lines.

CITATION LIST

Non-Patent Document

[Non-Patent Document 1]
A Ka-band Digitally-Controlled Phase Shifter with sub-degree Phase Precision (2016, IEEE, RFIC)

SUMMARY OF INVENTION

Technical Problem

The digital phase shift circuit supplies signal waves to which a predetermined phase shift amount is added to a circuit connected to a rear stage thereof (a rear-stage circuit). When the signal waves are supplied to the rear-stage circuit, there is a problem in that electric power of the signal waves supplied to the rear-stage circuit decreases when an output reflection coefficient of the digital phase shift circuit increases. When the output reflection coefficient increases, there is also a problem in that fluctuation of the phase shift amount in the digital phase shift circuit increases.

That is, in the related art, there is a problem in that the output reflection coefficient increases as a ratio of mismatch between an output impedance of the digital phase shift circuit and an input impedance of the rear-stage circuit increases. As a result, in the related art, there is a problem in that a decrease in electric power supplied to the rear-stage circuit or fluctuation of a desired phase shift amount in the digital phase shift circuit is caused.

The present invention is made in consideration of the aforementioned circumstances and an objective thereof is to provide a digital phase shift circuit and a digital phase shifter that can decrease an output reflection coefficient in comparison with the related art.

Solution to Problem

In order to achieve the aforementioned objective, according to a first solution of a digital phase shift circuit according to the present invention, there is provided a digital phase shift circuit including: a basic phase shift circuit including a signal line, a pair of inner lines provided on both sides of the signal line, a pair of outer lines provided outside of the inner lines, a first grounding conductor connected to one ends of the pair of inner lines and the pair of outer lines, a second grounding conductor connected to the other ends of the pair of outer lines, and a pair of electronic switches, one of the pair of electronic switches being provided between the other end of one of the pair of inner lines and the second grounding conductor, and the other of the pair of electronic switches being provided between the other end of the other of the pair of inner lines and the second grounding conductor; and an output circuit configured to decrease an output load of the basic phase shift circuit in comparison with an input load thereof.

A second solution of the digital phase shift circuit according to the present invention is the digital phase shift circuit according to the first solution, wherein the output circuit includes an output signal line that is connected to the signal line and has a larger line width than the signal line.

A third solution of the digital phase shift circuit according to the present invention is the digital phase shift circuit according to the second solution, wherein the output signal line is provided in a conductive layer different from a conductive layer in which the signal line is provided.

A fourth solution of the digital phase shift circuit according to the present invention is the digital phase shift circuit according to the third solution, wherein the output signal line is provided in the conductive layer above the conductive layer in which the signal line is provided, the output circuit includes a first output grounding line provided in the same conductive layer as the inner line and the outer line, and the first output grounding line is connected to the inner line and the outer line.

A fifth solution of the digital phase shift circuit according to the present invention is the digital phase shift circuit according to any one of the second to fourth solutions, wherein the output circuit includes a second output grounding line and a third output grounding line provided on both sides of the output signal line.

A sixth solution of the digital phase shift circuit according to the present invention is the digital phase shift circuit according to any one of the second to fifth solutions, wherein the output circuit includes an open stub connected to the output signal line.

A seventh solution of the digital phase shift circuit according to the present invention is the digital phase shift circuit according to the sixth solution, wherein the open stub is provided in the same conductive layer as the signal line.

An eighth solution of the digital phase shift circuit according to the present invention is the digital phase shift circuit according to the sixth or seventh solution, wherein the output circuit includes a stub grounding line provided to surround the open stub.

A ninth solution of the digital phase shift circuit according to the present invention is the digital phase shift circuit according to any one of the first to eighth solutions, wherein the basic phase shift circuit includes a first inner-outer grounding line connecting one end of one inner line out of the pair of inner lines and one end of one outer line out of the pair of outer lines and a second inner-outer grounding line connecting one end of the other inner line out of the pair of inner lines and one end of the other outer line out of the pair of outer lines, and the first inner-outer grounding line and the second inner-outer grounding line are connected to the first grounding conductor through a via.

A tenth solution of the digital phase shift circuit according to the present invention is the digital phase shift circuit according to any one of the first to ninth solutions, wherein the basic phase shift circuit includes a capacitor of which one end is connected to the signal line and of which the other end is connected to at least one of the first grounding conductor and the second grounding conductor.

An eleventh solution of the digital phase shift circuit according to the present invention is the digital phase shift circuit according to the tenth solution, wherein a capacitor electronic switch is provided between a lower electrode of the capacitor and at least one of the first grounding conductor and the second grounding conductor.

According to a first solution of a digital phase shifter according to the present invention, there is provided a digital phase shifter in which basic phase shift circuits are connected in a cascade manner of multiple stages, each of the basic shift circuits is the basic shift circuit of the digital phase shift circuit according to any one of the first to eleventh solutions, wherein the output circuit is provided in only the basic phase shift circuit located in a rearmost stage.

According to a second solution of the digital phase shifter according to the present invention, there is provided a digital phase shifter in which basic phase shift circuits are connected in a cascade manner of multiple stages in multiple rows, each of basic phase shift circuits is the basic shift circuit of the digital phase shift circuit according to any one of the sixth to eighth solutions, wherein the output circuit is provided to only the basic phase shift circuit located in a rearmost stage, and the open stub is provided between the rows of the basic phase shift circuits.

Advantageous Effects of Invention

According to the present invention, it is possible to provide a digital phase shift circuit and a digital phase shifter that can decrease an output reflection coefficient in comparison with the related art.

DESCRIPTION OF EMBODIMENTS

Hereinafter, embodiments of the present invention are described with reference to the accompanying drawings.

Figure 1:
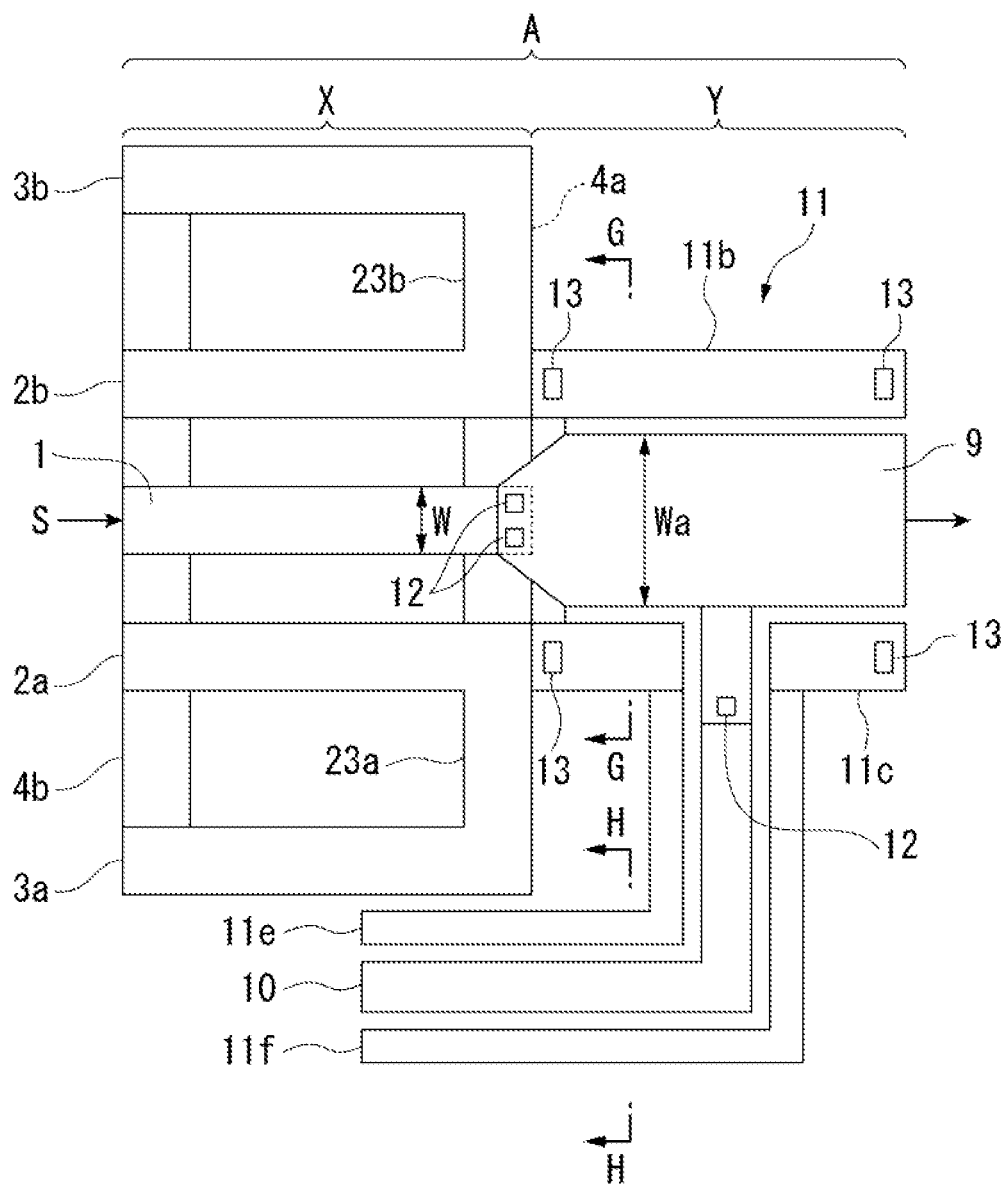
FIG. 1 is a front view illustrating a configuration of a digital phase shift circuit A according to an embodiment of the present invention.

A digital phase shift circuit A according to an embodiment is first described below with reference to FIGS. 1 to 3B. As illustrated in FIG. 1, the digital phase shift circuit A is a high-frequency circuit that receives a high-frequency signal S such as microwaves, submillimeter waves, or millimeter waves as an input and outputs a plurality of signals phase-shifted by a predetermined phase shift amount from the high-frequency signals S to the outside.

Figure 2:
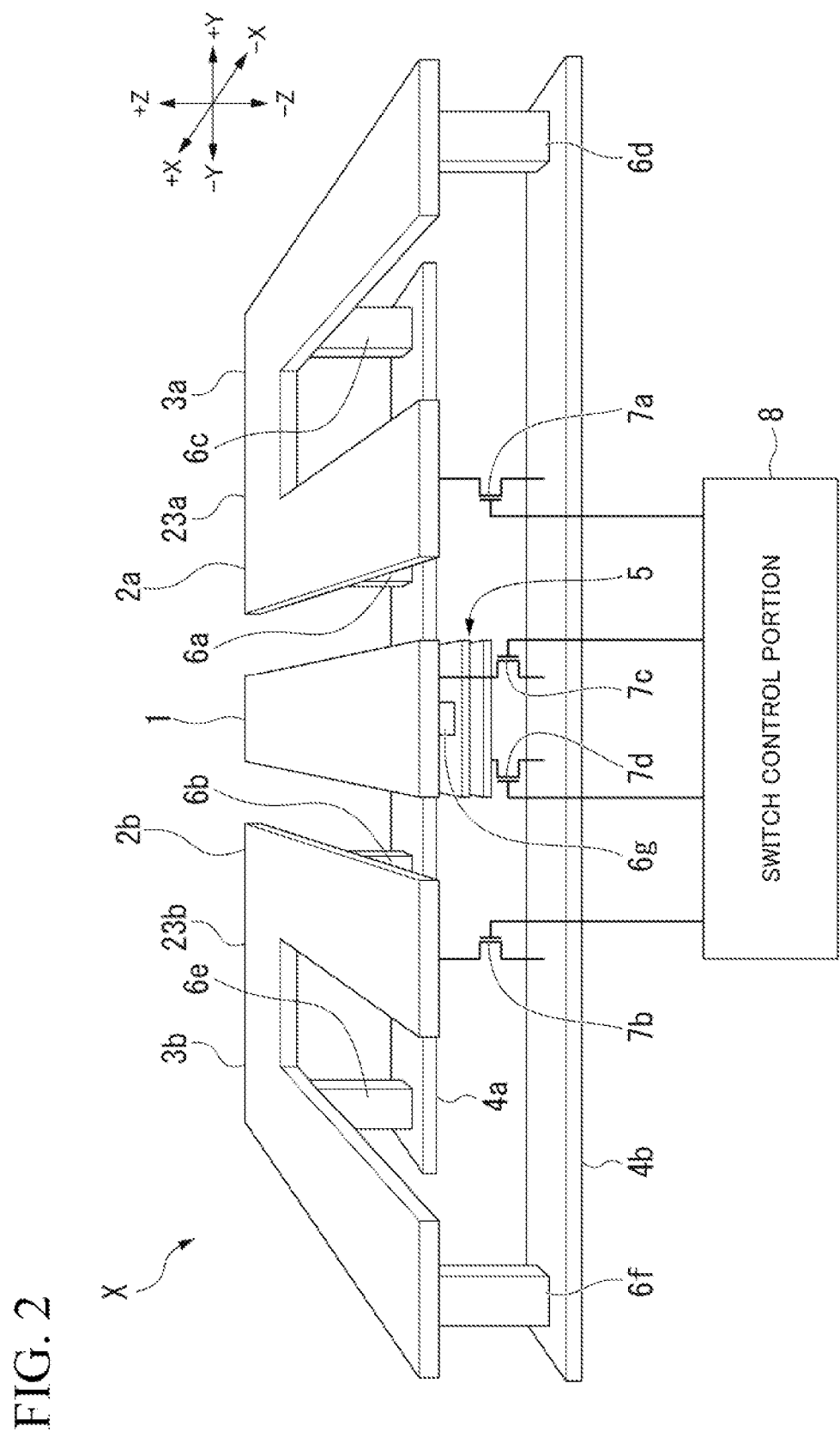
FIG. 2 is a conceptual diagram illustrating a functional configuration of a basic phase shift circuit X according to the embodiment of the present invention.

In the following description, a front-rear direction in FIG. 2 is defined as an X-axis direction, a left-right direction is defined as a Y-axis direction, and an up-down direction is defined as a Z-axis direction.

The digital phase shift circuit A is formed as a stacked structure in which a plurality of conductive layers are stacked with insulating layers therebetween using semiconductor manufacturing technology. FIG. 1 is a front view (a plan view) illustrating a front structure (a planar structure) of the digital phase shift circuit A which is the stacked structure from a certain layer to lower layers. The digital phase shift circuit A includes a basic phase shift circuit X and an output circuit Y as illustrated in FIG. 1.

The basic phase shift circuit X is a high-frequency delay circuit that delays a high-frequency signal S input from the outside by a predetermined phase. The basic phase shift circuit X includes a plurality of elements which are difficult to illustrate in FIG. 1 which is a front view (a plan view). In the following description, a detailed configuration of the basic phase shift circuit X is described also with reference to FIG. 2 (a conceptual diagram) illustrating the functional configuration of the basic phase shift circuit X.

As illustrated in FIG. 2, the basic phase shift circuit X includes a signal line 1, a pair of inner lines 2a and 2b, a pair of outer lines 3a and 3b, a pair of inner-outer grounding lines 23a and 23b, a pair of grounding conductors 4a and 4b, a capacitor 5, seven connection conductors 6a to 6g, four electronic switches 7a to 7d, and a switch control portion 8.

The signal line 1 is a linear belt-shaped conductor that extends in a predetermined direction (the X-axis direction) as illustrated in FIG. 2. That is, the signal line 1 is a long plate-shaped conductor that has a certain width, a certain thickness, and a predetermined length. In the signal line 1, a signal current flows from a front side to a rear side, that is, from the front-side end (an input end) to a rear-side end (an output end).

In terms of electrical properties, the signal line 1 has an inductance L1 which is a distribution circuit constant. The inductance L1 is a parasitic inductance with a magnitude corresponding to the shape of the signal line 1 such as the length of the signal line 1. In terms of electrical properties, the signal line 1 also has a capacitance C1 which is a distributed circuit constant. The capacitance C1 is a parasitic capacitance between the signal line and the inner line or the outer line or between silicon substrates.

The pair of inner lines 2a and 2b are linear belt-shaped conductors that are provided on both sides of the signal line 1. Out of the pair of inner lines 2a and 2b, the first inner line 2a is a long plate-shaped conductor that is separated on one side of the signal line 1 (the right side in FIG. 2) and has a certain width, a certain thickness, and a predetermined length. That is, the first inner line 2a is provided in parallel to the signal line 1 with a predetermined distance therebetween and extends in the same direction as the extension direction of the signal line 1.

The second inner line 2b is a long plate-shaped conductor that is separated on the other side of the signal line 1 (the left side in FIG. 2) and has a certain width, a certain thickness, and a predetermined length similarly to the first inner line 2a. The second inner line 2b is provided in parallel to the signal line 1 with the same predetermined distance from the first inner line 2a therebetween and extends in the same direction as the extension direction of the signal line 1 similarly to the first inner line 2a.

The first outer line 3a is a linear belt-shaped conductor that is provided outside of the first inner line 2a on the one side of the signal line 1. That is, the first outer line 3a is a long plate-shaped conductor that has a certain width, a certain thickness, and a predetermined length and is provided at a position farther from the signal line 1 than the first inner line 2a on the one side of the signal line 1.

The first outer line 3a is provided in parallel to the signal line 1 with a predetermined distance therebetween in a state in which the first inner line 2a is interposed therebetween as illustrated in the drawing. That is, the first outer line 3a extends in the same direction as the extension direction of the signal line 1 similarly to the first inner line 2a and the second inner line 2b.

The second outer line 3b is a linear belt-shaped conductor that is provided outside of the second inner line 2b on the other side of the signal line 1, that is, on the opposite side to the first outer line 3a. That is, the second outer line 3b is a long plate-shaped conductor that has a certain width, a certain thickness, and a predetermined length and is provided at a position farther from the signal line 1 than the second inner line 2b on the other side of the signal line 1.

The second outer line 3b is provided in parallel to the signal line 1 with a predetermined distance therebetween in a state in which the second inner line 2b is interposed therebetween as illustrated in the drawing. That is, the second outer line 3b extends in the same direction as the extension direction of the signal line 1 similarly to the first inner line 2a, the second inner line 2b, and the first outer line 3a.

The pair of inner-outer grounding line 23a and 23b are linear belt-shaped conductors that are provided at one ends (on the output circuit Y side) of the pair of inner lines 2a and 2b and the pair of outer lines 3a and 3b as illustrated in the drawing. Out of the pair of inner-outer grounding lines 23a and 23b, the first inner-outer grounding line 23a connects one end of the first inner line 2a (one inner line) and one end of the first outer line 3a (one outer line), and the second inner-outer grounding line 23b connects one end of the second inner line 2b (the other inner line) and one end of the second outer line 3b (the other outer line). The first inner-outer grounding line 23a and the second inner-outer grounding line 23b are connected to the first grounding conductor 4a located in a lower layer through a via.

The first grounding conductor 4a is a linear belt-shaped conductor that is provided at a side of one ends of the first inner line 2a, the second inner line 2b, the first outer line 3a, and the second outer line 3b. That is, the first grounding conductor 4a is a long plate-shaped conductor that has a certain width, a certain thickness, and a predetermined length and is electrically grounded.

The first grounding conductor 4a is provided to be perpendicular to the first inner line 2a, the second inner line 2b, the first outer line 3a, and the second outer line 3b which extend in the same direction. That is, the first grounding conductor 4a is provided to extend in the left-right direction (the Y-axis direction) at a side of one ends of the first inner line 2a, the second inner line 2b, the first outer line 3a, and the second outer line 3b.

The first grounding conductor 4a is provided a predetermined distance below the first inner line 2a, the second inner line 2b, the first outer line 3a, and the second outer line 3b. That is, a predetermined distance in the up-down direction (the Z-axis direction) is provided between the first grounding conductor 4a and ends (one ends) of the first inner line 2a, the second inner line 2b, the first outer line 3a, and the second outer line 3b.

Here, the first grounding conductor 4a is provided such that one end thereof in the left-right direction (the right end in FIG. 2) is located substantially at the same position as the right edge of the first outer line 3a in the left-right direction. The first grounding conductor 4a is provided such that the other end thereof in the left-right direction (the left end in FIG. 2) is located substantially at the same position as the left edge of the second outer line 3b in the left-right direction.

The second grounding conductor 4b is a linear belt-shaped conductor that is provided at a side of the other ends of the first inner line 2a, the second inner line 2b, the first outer line 3a, and the second outer line 3b. That is, the second grounding conductor 4b is a long plate-shaped conductor that has a certain width, a certain thickness, and a predetermined length and is electrically grounded.

The second grounding conductor 4b is provided to be perpendicular to the first inner line 2a, the second inner line 2b, the first outer line 3a, and the second outer line 3b which extend in the same direction. That is, the second grounding conductor 4b is provided to extend in the left-right direction at a side of the other ends of the first inner line 2a, the second inner line 2b, the first outer line 3a, and the second outer line 3b.

The second grounding conductor 4b is provided a predetermined distance below the first inner line 2a, the second inner line 2b, the first outer line 3a, and the second outer line 3b. That is, a predetermined distance in the up-down direction is provided between the second grounding conductor 4b and ends (the other ends) of the first inner line 2a, the second inner line 2b, the first outer line 3a, and the second outer line 3b.

Here, the second grounding conductor 4b is provided such that one end thereof in the left-right direction (the right end in FIG. 2) is located substantially at the same position as the right edge of the first outer line 3a in the left-right direction. The second grounding conductor 4b is provided such that the other end thereof in the left-right direction (the left end in FIG. 2) is located substantially at the same position as the left edge of the second outer line 3b in the left-right direction. That is, the second grounding conductor 4b has the same position as the first grounding conductor 4a in the left-right direction.

The capacitor 5 includes parallel plates of which an upper electrode is connected to the signal line 1 via the seventh connection conductor 6g and a lower electrode is connected to the second grounding conductor 4b via the fourth electronic switch 7d. The capacitor 5 has a capacitance Ca corresponding to the opposite area of the parallel plates. That is, the capacitance Ca is a circuit constant that is provided between the signal line 1 and the second grounding conductor 4b.

The first connection conductor 6a is a conductor that electrically and mechanically connects one end of the first inner line 2a and the first grounding conductor 4a. That is, the first connection conductor 6a is a conductor extending in the up-down direction, one end (an upper end) thereof is connected to the lower surface of the first inner line 2a, and the other end (a lower end) thereof is connected to the upper surface of the first grounding conductor 4a.

The second connection conductor 6b is a conductor that electrically and mechanically connects one end of the second inner line 2b and the first grounding conductor 4a. That is, the second connection conductor 6b is a conductor extending in the up-down direction similarly to the first connection conductor 6a, one end (an upper end) thereof is connected to the lower surface of the second inner line 2b, and the other end (a lower end) thereof is connected to the upper surface of the first grounding conductor 4a.

The third connection conductor 6c is a conductor that electrically and mechanically connects one end of the first outer line 3a and the first grounding conductor 4a. That is, the third connection conductor 6c is a conductor extending in the up-down direction, one end (an upper end) thereof is connected to the lower surface of one end of the first outer line 3a, and the other end (a lower end) thereof is connected to the upper surface of the first grounding conductor 4a.

The fourth connection conductor 6d is a conductor that electrically and mechanically connects the other end of the first outer line 3a and the second grounding conductor 4b. That is, the fourth connection conductor 6d is a conductor extending in the up-down direction, one end (an upper end) thereof is connected to the lower surface of the other end of the first outer line 3a, and the other end (a lower end) thereof is connected to the upper surface of the second grounding conductor 4b.

The fifth connection conductor 6e is a conductor that electrically and mechanically connects one end of the second outer line 3b and the first grounding conductor 4a. That is, the fifth connection conductor 6e is a conductor extending in the up-down direction, one end (an upper end) thereof is connected to the lower surface of one end of the second outer line 3b, and the other end (a lower end) thereof is connected to the upper surface of the first grounding conductor 4a.

The sixth connection conductor 6f is a conductor that electrically and mechanically connects the other end of the second outer line 3b and the second grounding conductor 4b. That is, the sixth connection conductor 6f is a conductor extending in the up-down direction, one end (an upper end) thereof is connected to the lower surface of the other end of the second outer line 3b, and the other end (a lower end) thereof is connected to the upper surface of the second grounding conductor 4b.

The seventh connection conductor 6g is a conductor that electrically and mechanically connects the other end of the signal line 1 and the upper electrode of the capacitor 5. That is, the seventh connection conductor 6g is a conductor extending in the up-down direction, one end (an upper end) thereof is connected to the lower surface of one end of the signal line 1, and the other end (a lower end) thereof is connected to the upper electrode (the upper surface) of the capacitor 5.

The first electronic switch 7a is a transistor that disconnectably connects the other end of the first inner line 2a and the second grounding conductor 4b. The first electronic switch 7a is, for example, a metal-oxide-semiconductor (MOS)-type field-effect transistor (FET) as illustrated in the drawing, a drain terminal thereof is connected to the other end of the first inner line 2a, a source terminal thereof is connected to the second grounding conductor 4b, and a gate terminal thereof is connected to the switch control portion 8.

The first electronic switch 7a switches a conduction state between the drain terminal and the source terminal to an open state or a closed state on the basis of a gate signal input to the gate terminal thereof from the switch control portion 8. That is, the first electronic switch 7a turns on/off connection between the other end of the first inner line 2a and the second grounding conductor 4b under the control of the switch control portion 8.

The second electronic switch 7b is a transistor that disconnectably connects the other end of the second inner line 2b and the second grounding conductor 4b. The second electronic switch 7b is an MOS FET similarly to the first electronic switch 7a, a drain terminal thereof is connected to the other end of the second inner line 2b, a source terminal thereof is connected to the second grounding conductor 4b, and a gate terminal thereof is connected to the switch control portion 8.

The second electronic switch 7b switches a conduction state between the drain terminal and the source terminal to an open state or a closed state on the basis of a gate signal input to the gate terminal thereof from the switch control portion 8. That is, the second electronic switch 7b turns on/off connection between the other end of the second inner line 2b and the second grounding conductor 4b under the control of the switch control portion 8.

The third electronic switch 7c is a transistor that disconnectably connects one end of the signal line 1 and the second grounding conductor 4b. The third electronic switch 7c is an MOS FET similarly to the first electronic switch 7a and the second electronic switch 7b, a drain terminal thereof is connected to one end of the signal line 1, a source terminal thereof is connected to the second grounding conductor 4b, and a gate terminal thereof is connected to the switch control portion 8. The third electronic switch 7c may be provided between the other end of the signal line 1 and the first grounding conductor 4a instead of between one end of the signal line 1 and the second grounding conductor 4b.

The third electronic switch 7c switches a conduction state between the drain terminal and the source terminal to an open state or a closed state on the basis of a gate signal input to the gate terminal thereof from the switch control portion 8. That is, the third electronic switch 7c turns on/off connection between one end of the signal line 1 and the second grounding conductor 4b under the control of the switch control portion 8.

The fourth electronic switch 7d is a transistor that disconnectably connects the other end of the capacitor 5 and the second grounding conductor 4b. The fourth electronic switch 7d is an MOS FET similarly to the first electronic switch 7a, the second electronic switch 7b, and the third electronic switch 7c, a drain terminal thereof is connected to the other end of the capacitor 5, a source terminal thereof is connected to the second grounding conductor 4b, and a gate terminal thereof is connected to the switch control portion 8.

The fourth electronic switch 7d switches a conduction state between the drain terminal and the source terminal to an open state or a closed state on the basis of a gate signal input to the gate terminal thereof from the switch control portion 8. That is, the fourth electronic switch 7d turns on/off connection between the other end of the capacitor 5 and the second grounding conductor 4b under the control of the switch control portion 8. The fourth electronic switch 7d corresponds to a capacitor electronic switch in the invention.

The switch control portion 8 is a control circuit that controls the first electronic switch 7a, the second electronic switch 7*b*, the third electronic switch 7*c*, and the fourth electronic switch 7*d*. The switch control portion 8 includes four output ports and individually outputs the gate signals from the corresponding output ports to the gate terminals of the first electronic switch 7*a*, the second electronic switch 7*b*, the third electronic switch 7*c*, and the fourth electronic switch 7*d*. That is, the switch control portion 8 controls ON/OFF operations of the first electronic switch 7*a*, the second electronic switch 7*b*, the third electronic switch 7*c*, and the fourth electronic switch 7*d* in accordance with the gate signals.

The output circuit Y is described below with reference to FIGS. 3A and 3B in addition to FIG. 1. The output circuit Y is connected to a rear stage of the basic phase shift circuit X in a cascade manner as illustrated in FIG. 1 and includes an output signal line 9, an open stub 10, and an output grounding line 11.

The output signal line 9 is a linear belt-shaped conductor that extends in the same direction as the signal line 1. The output signal line 9 is a long plate-shaped conductor that has a certain width, a certain thickness, and a predetermined length, one end (the left end) thereof is connected to the other end (the output end) of the signal line 1, and the other end (the right end) thereof is connected to an external load circuit. In the output signal line 9, a signal current of a high-frequency signal S flows from one end (the left end) to the other end (the right end). A portion of the output signal line 9 near the signal line 1 is set to a taper shape such that the width thereof increases gradually as illustrated in FIG. 1.

The output signal line 9 is set such that a line width Wa is larger than a line width W of the signal line 1. That is, the output signal line 9 is set such that a sectional area thereof through which the signal current flows is larger than the sectional area of the signal line 1. The output signal line 9 has a circuit function of decreasing an output load of the basic phase shift circuit X such that the output load of the basic phase shift circuit X is less than an input load thereof.

Here, in the basic phase shift circuit X, the signal line 1, the first inner line 2*a*, the second inner line 2*b*, the first outer line 3*a*, and the second outer line 3*b* are formed in a first conductive layer, and the first grounding conductor 4*a* and the second grounding conductor 4*b* are formed in a second conductive layer (a lower layer) facing the first conductive layer with an insulating layer.

The elements of the first conductive layer, the elements of the second conductive layer, the capacitor 5, and the first to fourth electronic switches 7*a* to 7*d* are connected to each other through vias (a through-holes). That is, the vias are buried in the insulating layer and serve as the first connection conductor 6*a*, the second connection conductor 6*b*, the third connection conductor 6*c*, the fourth connection conductor 6*d*, the fifth connection conductor 6*e*, the sixth connection conductor 6*f*, and the seventh connection conductor 6*g*.

Specifically, the elements of the first conductive layer and the elements of the second conductive layer are connected to each other through the vias serving as the first connection conductor 6*a*, the second connection conductor 6*b*, the third connection conductor 6*c*, the fourth connection conductor 6*d*, the fifth connection conductor 6*e*, and the sixth connection conductor 6*f*. The elements of the first conductive layer and the capacitor 5 are connected to each other via the via serving as the seventh connection conductor 6*g*.

With respect to the basic phase shift circuit X, the output signal line 9 of the output circuit Y is formed in a third conductive layer that faces the first conductive layer with an insulating layer and is stacked on the side opposite to the second conductive layer (the lower layer) with the first conductive layer therebetween. The third conductive layer is a conductive layer above the first conductive layer. That is, the signal line 1 of the basic phase shift circuit X and the output signal line 9 of the output circuit Y are formed in different conductive layers, and the signal line 1 and the output signal line 9 are connected to each other via a signal-line via 12 (through-hole) as illustrated in FIG. 3A. FIG. 3A is a sectional view (a first sectional view) facing the output circuit Y from the tip end (the right side) of the output signal line 9.

The open stub 10 is a line which is provided to branch from the output signal line 9 and of which the tip is an open end. For example, the open stub 10 has a shape branching from a halfway portion of the output signal line 9 in a direction perpendicular to the extending direction of the output signal line 9 and being bent halfway in the extending direction of the output signal line 9 as illustrated in FIG. 1. That is, a portion of the open stub 10 following the bent portion thereof is located on one side of the basic phase shift circuit X.

Here, the open stub 10 is formed in the third conductive layer in the vicinity of a connection point to the output signal line 9 similarly to the output signal line 9, but is formed in the first conductive layer from the halfway portion similarly to the signal line 1. That is, the open stub 10 has a structure to which the halfway portion is connected by a signal-line via 12 as illustrated in FIG. 1.

Specifications of the open stub 10 are set such that an output impedance of the basic phase shift circuit X which is expressed as a complex number is changed to a real number. That is, the shape such as the length of the open stub 10 is set such that the output impedance of the basic phase shift circuit X is changed to a real number.

A stub in a high-frequency circuit is a known circuit element. A short stub of which a tip is grounded as well as the open stub 10 as in this embodiment is known as a general stub. However, the inventor of the present disclosure finds that, when the output impedance of the basic phase shift circuit X is changed to a real number, the output impedance cannot be changed to a real number using the short stub, but can be changed to a real number using only the open stub 10.

The output grounding line 11 is a grounding line that is provided to surround both sides of the output signal line 9 and four sides of the open stub 10 and is electrically grounded. That is, the output grounding line 11 is provided to surround the output signal line 9 from two sides in the Y-axis direction and is provided to surround the open stub 10 from two sides in the Z-axis direction and two sides in the X-axis direction and the Y-axis direction perpendicular to the extending direction of the open stub 10. In the following description, both sides in the direction perpendicular to the extending direction of the output signal line 9 or the open stub 10 in a plan view may be referred to as the right and left sides of the output signal line 9 or the open stub 10.

Figure 3A:
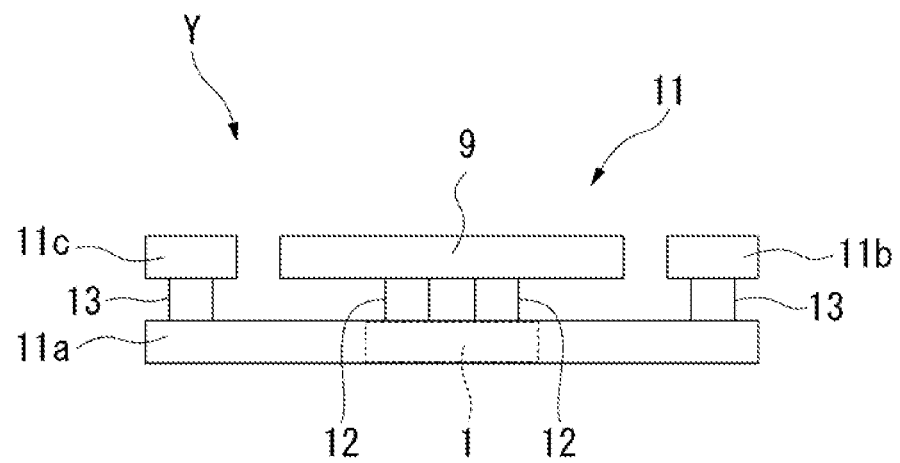
FIG. 3A is a sectional view along line G-G in FIG. 1.
Figure 3B:
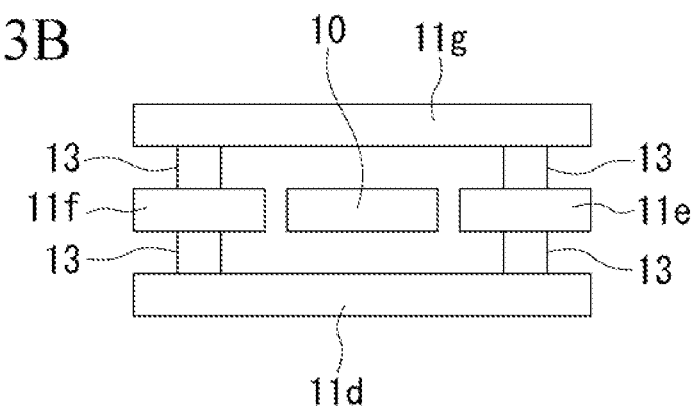
FIG. 3B is a sectional view along line H-H in FIG. 1.

The output grounding line 11 includes a plurality of individual grounding lines 11*a* to 11*g* as illustrated in FIG. 1 and FIGS. 3A and 3B. As illustrated in FIGS. 3A and 3B, the individual grounding lines 11*a* to 11*g* are connected to each other through grounding-line vias 13. Specifically, using the grounding-line vias 13, the individual grounding line 11*a* is connected to the individual grounding line 11*b* and the individual grounding line 11*c*, and the individual grounding line 11*e* and the individual grounding line 11*f* are connected to the individual grounding line 11*d* and the individual grounding line 11*g*.

Among these individual grounding lines 11a to 11g, the first to third individual grounding lines 11a to 11c are grounding lines (signal-line grounding lines) formed on the right and left sides of the output signal line 9 and below the output signal line 9. The fourth to seventh individual grounding lines 11d to 11g are grounding lines (stub grounding lines) surrounding the open stub 10 from the right and left sides and from up and down sides thereof.

Among the first to third individual grounding lines 11a to 11c, the first individual grounding line 11a is a first output grounding line that covers the bottom of the output signal line 9 as illustrated in FIG. 3A. That is, the first individual grounding line 11a is formed in a layer below the output signal line 9, that is, in the first conductive layer, and has a function of blocking electromagnetic waves radiated downward from the output signal line 9. The first individual grounding line 11a is connected to the inner line and the outer line in the first conductive layer.

The second individual grounding line 11b is a second output grounding line that covers the right side of the output signal line 9 as illustrated in FIG. 3A. That is, the second individual grounding line 11b is formed in the same layer as the output signal line 9, that is, in the third conductive layer, and has a function of blocking electromagnetic waves radiated rightward from the output signal line 9.

The third individual grounding line 11c is a third output grounding line that covers the left side of the output signal line 9 as illustrated in FIG. 3A. That is, the third individual grounding line 11c is formed in the third conductive layer, similarly to the second individual grounding line 11b and has a function of blocking electromagnetic waves radiated leftward from the output signal line 9.

Among the fourth to seventh individual grounding lines 11d to 11g, the fourth individual grounding line 11d is a grounding line that covers the bottom of the open stub 10 as illustrated in FIG. 3B. That is, the fourth individual grounding line 11d is formed in a layer below the open stub 10, that is, in a layer (for example, the second conductive layer) below the first conductive layer, and has a function of blocking electromagnetic waves radiated downward from the open stub 10.

The fifth individual grounding line 11e is a grounding line that covers the right side of the open stub 10 as illustrated in FIG. 3B. That is, the fifth individual grounding line 11e is formed in the same layer as the open stub 10, that is, in the first conductive layer, and has a function of blocking electromagnetic waves radiated rightward from the open stub 10.

The sixth individual grounding line 11f is a grounding line that covers the left side of the open stub 10 as illustrated in FIG. 3B. That is, the sixth individual grounding line 11f is formed in the same layer as the open stub 10, that is, in the first conductive layer, and has a function of blocking electromagnetic waves radiated leftward from the open stub 10.

The seventh individual grounding line 11g is a grounding line that covers the top of the open stub 10 as illustrated in FIG. 3B. That is, the seventh individual grounding line 11g is formed in a layer above the open stub 10, that is, in the third conductive layer, and has a function of blocking electromagnetic waves radiated upward from the open stub 10.

A digital phase shifter B according to this embodiment is described below with reference to FIG. 4.

Figure 4:
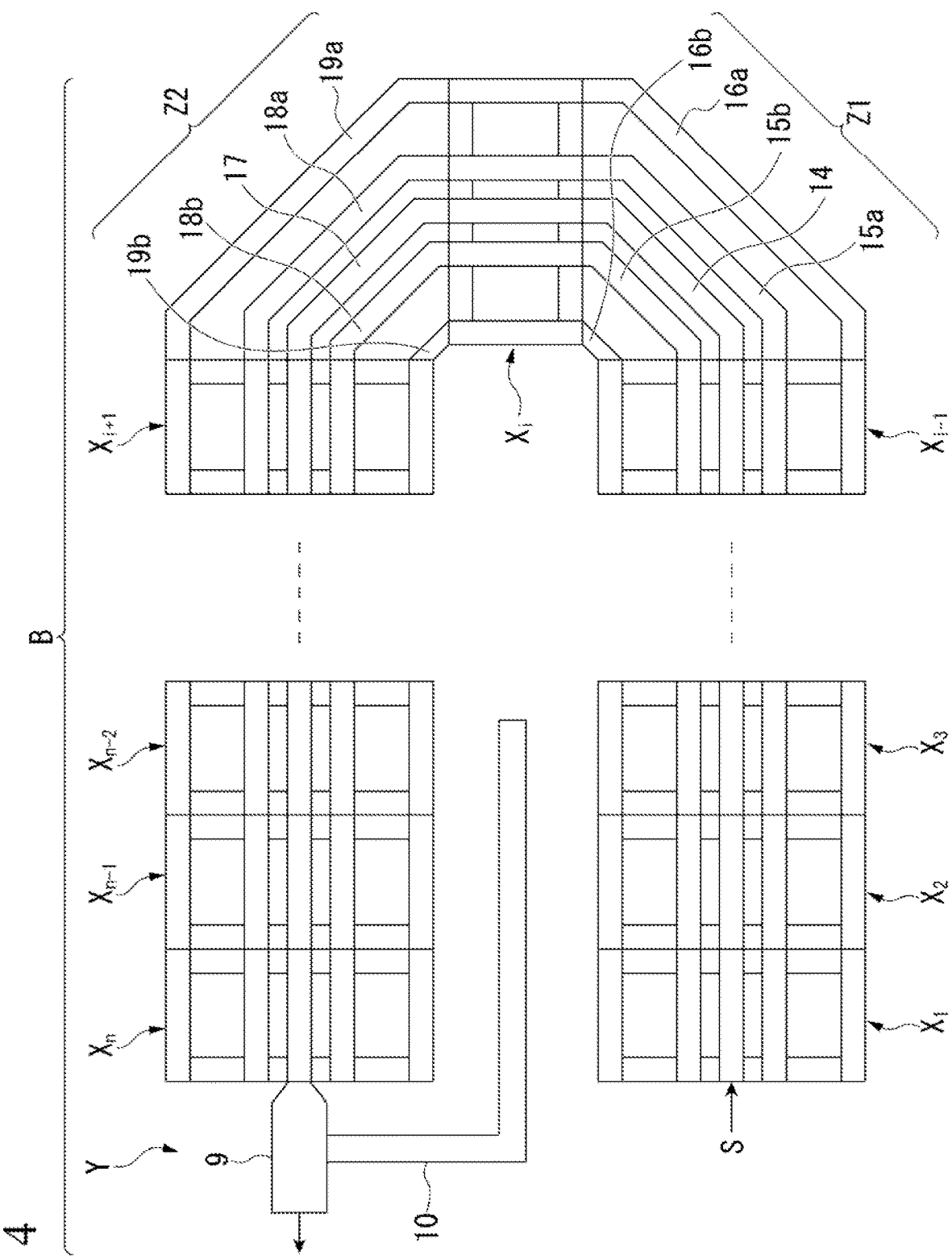
FIG. 4 is a front view illustrating a configuration of a digital phase shifter B according to the embodiment of the present invention.

As illustrated in FIG. 4, the digital phase shifter B includes a plurality of ("n") basic phase shift circuits $X_1$ to $X_n$, a single output circuit Y, and a pair of connection circuits Z1 and Z2. In this embodiment, "n" is a natural number. In the following description, "i" is a natural number equal to or greater than two and equal to or less than "n".

The "n" basic phase shift circuits $X_1$ to $X_n$, the single output circuit Y, and the pair of connection circuits Z1 and Z2 are connected in a cascade manner of multiple stages in two rows (in multiple rows) as illustrated in FIG. 4. The array of two rows in FIG. 4 is only an example. That is, the array of the "n" basic phase shift circuits $X_1$ to $X_n$ may be three or more rows.

In the digital phase shifter B, a transmission direction of a high-frequency signal S is directed from the first basic phase shift circuit $X_1$ to the n-th basic phase shift circuit $X_n$. That is, the first basic phase shift circuit $X_1$ is located most upstream in the transmission direction of the high-frequency signal S, and the n-th basic phase shift circuit $X_n$ is located most downstream (the rearmost stage) in the transmission direction of the high-frequency signal S.

More specifically, among the "n" basic phase shift circuits $X_1$ to $X_n$, the first to (i−1)-th basic phase shift circuits $X_1$ to $X_{i-1}$ are linearly connected in a cascade manner and form a first linear part. The (i+1)-th to n-th basic phase shift circuits $X_{i+1}$ to $X_n$ are linearly connected in a cascade manner and form a second linear part different from the first linear part.

That is, the first to (i−1)-th basic phase shift circuits $X_1$ to $X_{i-1}$ and the (i+1)-th to n-th basic phase shift circuits $X_{i+1}$ to $X_n$ are arranged in two rows (multiple rows). In the first to (i−1)-th basic phase shift circuits $X_1$ to $X_{i-1}$ and the (i+1)-th to n-th basic phase shift circuits $X_{i+1}$ to $X_n$, the signal lines 1 of the neighboring ones are connected to each other in a line.

In the first to (i−1)-th basic phase shift circuits $X_1$ to $X_{i-1}$ and the (i+1)-th to n-th basic phase shift circuits $X_{i+1}$ to $X_n$, the first inner lines 2a of the neighboring ones, the second inner lines 2b of the neighboring ones, the first outer lines 3a of the neighboring ones, and the second outer lines 3b of the neighboring ones are connected to each other in a line. In the first to (i−1)-th basic phase shift circuits $X_1$ to $X_{i-1}$ and the (i+1)-th to n-th basic phase shift circuits $X_{i+1}$ to $X_n$, the neighboring first grounding conductor 4a and the second grounding conductor 4b are connected to each other.

Here, the i-th basic phase shift circuit $X_i$ out of the "n" basic phase shift circuits $X_1$ to $X_n$ does not form the first linear part and the second linear part and is provided in a state in which it is interposed between the pair of connection circuits Z1 and Z2. Here, the i-th basic phase shift circuit $X_i$ may be a constituent of the first linear part or the second linear part.

As illustrated in FIG. 4, the output circuit Y is connected to a rear stage of the n-th basic phase shift circuit $X_n$ located in the rearmost stage (most downstream). That is, the output signal line 9 of the output circuit Y is connected to the output end (the other end) of the signal line 1 in the n-th basic phase shift circuit $X_n$ through the signal-line via 12 (through-hole) (see FIG. 3A).

The pair of connection circuits Z1 and Z2 are lines connecting the first linear part and the second linear part in a parallel state. The first connection circuit Z1 out of the pair of connection circuits Z1 and Z2 connects the (i−1)-th basic phase shift circuit $X_{i-1}$ located in the rearmost stage of the first linear part and the i-th basic phase shift circuit $X_i$ as illustrated in the drawing. The first connection circuit Z1 includes five individual connection lines 14, 15a, 15b, 16a, and 16b as illustrated in the drawing.

Out of the individual connection lines 14, 15a, 15b, 16a, and 16b, the first individual connection line 14 is a belt-shaped conductor that connects the output end (the other end) of the signal line 1 in the (i−1)-th basic phase shift circuit $X_{i-1}$ and the input end (one end) of the signal line 1 in the i-th basic phase shift circuit $X_i$. The first individual connection line 14 is a long plate-shaped conductor that has a certain width, a certain thickness, and a predetermined length and extends obliquely as illustrated in the drawing (in the plan view illustrated in FIG. 4).

The second individual connection line 15a is a belt-shaped conductor that connects one end of the first inner line 2a in the (i−1)-th basic phase shift circuit $X_{i-1}$ and the other end of the first inner line 2a in the i-th basic phase shift circuit $X_i$. The second individual connection line 15a is a long plate-shaped conductor that has a certain width, a certain thickness, and a predetermined length and extends obliquely similarly to the first individual connection line 14.

The third individual connection line 15b is a belt-shaped conductor that connects one end of the second inner line 2b in the (i−1)-th basic phase shift circuit $X_{i-1}$ and the other end of the second inner line 2b in the i-th basic phase shift circuit $X_i$. The third individual connection line 15b is a long plate-shaped conductor that has a certain width, a certain thickness, and a predetermined length and extends obliquely similarly to the first individual connection line 14.

The fourth individual connection line 16a is a belt-shaped conductor that connects one end of the first outer line 3a in the (i−1)-th basic phase shift circuit $X_{i-1}$ and the other end of the first outer line 3a in the i-th basic phase shift circuit $X_i$. The fourth individual connection line 16a is a long plate-shaped conductor that has a certain width, a certain thickness, and a predetermined length and extends obliquely similarly to the first individual connection line 14.

The fifth individual connection line 16b is a belt-shaped conductor that connects one end of the second outer line 3b in the (i−1)-th basic phase shift circuit $X_{i-1}$ and the other end of the second outer line 3b in the i-th basic phase shift circuit $X_i$. The fifth individual connection line 16b is a long plate-shaped conductor that has a certain width, a certain thickness, and a predetermined length and extends obliquely similarly to the first individual connection line 14.

On the other hand, the second connection circuit Z2 connects the i-th basic phase shift circuit $X_i$ and the (i+1)-th basic phase shift circuit $X_{i+1}$ located in the frontmost stage in the second linear part as illustrated in the drawing. The second connection circuit Z2 includes five individual connection lines 17, 18a, 18b, 19a, and 19b as illustrated in the drawing.

Out of the individual connection lines 17, 18a, 18b, 19a, and 19b, the sixth individual connection line 17 is a belt-shaped conductor that connects the output end (the other end) of the signal line 1 in the i-th basic phase shift circuit $X_i$ and the input end (one end) of the signal line 1 in the (i+1)-th basic phase shift circuit $X_{i+1}$. The sixth individual connection line 17 is a long plate-shaped conductor that has a certain width, a certain thickness, and a predetermined length and extends obliquely as illustrated in the drawing (in the plan view illustrated in FIG. 4).

The seventh individual connection line 18a is a belt-shaped conductor that connects one end of the first inner line 2a in the i-th basic phase shift circuit $X_i$ and the other end of the first inner line 2a in the (i+1)-th basic phase shift circuit $X_{i+1}$. The seventh individual connection line 18a is a long plate-shaped conductor that has a certain width, a certain thickness, and a predetermined length and extends obliquely similarly to the sixth individual connection line 17.

The eighth individual connection line 18b is a belt-shaped conductor that connects one end of the second inner line 2b in the i-th basic phase shift circuit $X_i$ and the other end of the second inner line 2b in the (i+1)-th basic phase shift circuit $X_{i+1}$. The eighth individual connection line 18b is a long plate-shaped conductor that has a certain width, a certain thickness, and a predetermined length and extends obliquely similarly to the sixth individual connection line 17.

The ninth individual connection line 19a is a belt-shaped conductor that connects one end of the first outer line 3a in the i-th basic phase shift circuit $X_i$ and the other end of the first outer line 3a in the (i+1)-th basic phase shift circuit $X_{i+1}$. The ninth individual connection line 19a is a long plate-shaped conductor that has a certain width, a certain thickness, and a predetermined length and extends obliquely similarly to the sixth individual connection line 17.

The tenth individual connection line 19b is a belt-shaped conductor that connects one end of the second outer line 3b in the i-th basic phase shift circuit $X_i$ and the other end of the second outer line 3b in the (i+1)-th basic phase shift circuit $X_{i+1}$. The tenth individual connection line 19b is a long plate-shaped conductor that has a certain width, a certain thickness, and a predetermined length and extends obliquely similarly to the sixth individual connection line 17.

Operations of the digital phase shift circuit A and the digital phase shifter B according to this embodiment are described below in detail.

The basic phase shift circuits X and $X_1$ to $X_n$ in the digital phase shift circuit A and the digital phase shifter B switch the operation mode according to the conduction states of the first to fourth electronic switches 7a to 7d. That is, the operations modes of the basic phase shift circuits X and $X_1$ to $X_n$ include a low-delay mode in which only the first electronic switch 7a and the second electronic switch 7b are set to the ON state by the switch control portion 8 and a high-delay mode in which only the fourth electronic switch 7d is similarly set to the ON state by the switch control portion 8.

In the low-delay mode, the switch control portion 8 sets the first electronic switch 7a and the second electronic switch 7b to the ON state and sets the fourth electronic switch 7d to the OFF state. That is, in the low-delay mode, a first phase difference $\theta_L$ less than a second phase difference $\theta_H$ in the high-delay mode is generated due to a first propagation delay time $T_L$ until the high-frequency signal S propagates from the input end (the other end) of the signal line 1 to the output end (one end) thereof.

The low-delay mode is described below in more detail. The other end of the first inner line 2a is connected to the second grounding conductor 4b because the first electronic switch 7a is set to the ON state. That is, one end of the first inner line 2a is normally connected to the first grounding conductor 4a via the first connection conductor 6a, and the other end thereof is connected to the second grounding conductor 4b via the first electronic switch 7a, whereby a first conduction path through which a current can flow between the one end and the other end is formed.

On the other hand, the other end of the second inner line 2b is connected to the second grounding conductor 4b because the second electronic switch 7b is set to the ON state. That is, one end of the second inner line 2b is normally connected to the first grounding conductor 4a via the second connection conductor 6b, and the other end thereof is connected to the second grounding conductor 4b via the second electronic switch 7b, whereby a second conduction path through which a current can flow between the one end and the other end is formed.

When a signal current flows from the input end to the output end in the signal line 1 in the state in which both ends of the first inner line 2a are connected, a return current of the signal current flows from one end to the other end in the first inner line 2a and the second inner line 2b due to the propagation of the signal current.

That is, due to flowing of the signal current in the signal line 1, a first return current in the reverse direction of the flowing direction of the signal current flows in the first inner line 2a forming the first conduction path. Due to flowing of the signal current in the signal line 1, a second return current in the reverse direction of the flowing direction of the signal current, that is, in the same direction as the first return current, flows in the second inner line 2b forming the second conduction path.

Here, the first return current flowing in the first inner line 2a and the second return current flowing in the second inner line 2b have the reverse direction of the flowing direction of the signal current. Accordingly, the first return current and the second return current operate to decrease the inductance L1 of the signal line 1 due to electromagnetic coupling between the signal line 1 and the first inner line 2a and electromagnetic coupling between the signal line 1 and the second inner line 2b. When a decrease of the inductance L1 is defined as ΔLs, an effective inductance Lm of the signal line 1 is (L1−ΔLs).

The signal line 1 has a capacitance C1 which is a parasitic capacitance as described above. In the low-delay mode, since the fourth electronic switch 7d is set to the OFF state, the capacitor 5 is not connected between the signal line 1 and the second grounding conductor 4b. That is, the capacitance Ca of the capacitor 5 does not affect the high-frequency signal S propagating in the signal line 1. Accordingly, the first propagation delay time $T_L$ proportional to $(Lm \times C1)^{1/2}$ acts on the high-frequency signal S propagating in the signal line 1.

The high-frequency signal S at the output end (one end) of the signal line 1 has a phase which is delayed by the first phase difference $\theta_L$ from the high-frequency signal S at the input end (the other end) of the signal line 1 due to the first propagation delay time $T_L$. That is, in the low-delay mode, since the inductance L1 of the signal line 1 decreases to the inductance Lm due to the first return current and the second return current, the original propagation delay time of the signal line 1 decreases and the first phase difference $\theta_L$ less than the original phase difference of the signal line 1 is realized as a result.

In the low-delay mode, since the third electronic switch 7c is set to the ON state, a loss of the signal line 1 is intentionally increased. This increase in loss is for setting the loss on the high-frequency signal S in the low-delay mode to be the same as the loss on the high-frequency signal S in the high-delay mode.

That is, the loss of the high-frequency signal S in the low-delay mode is apparently smaller than the loss of the high-frequency signal S in the high-delay mode. This difference in loss causes a difference in amplitude of the high-frequency signal S output from the digital phase shift circuit A when the operation mode is switched between the low-delay mode and the high-delay mode. With regard to this circumstance, the digital phase shift circuit A resolves the difference in amplitude by setting the third electronic switch 7c to the ON state in the low-delay mode.

On the other hand, in the high-delay mode, the switch control portion 8 sets the first electronic switch 7a, the second electronic switch 7b, and the third electronic switch 7c to the OFF state and sets the fourth electronic switch 7d to the ON state. That is, in the high-delay mode, a second phase difference $\theta_H$ greater than the first phase difference $\theta_L$ in the low-delay mode is generated due to a second propagation delay time $T_H$ until the high-frequency signal S propagates from the input end (the other end) of the signal line 1 to the output end (one end) thereof.

In the high-delay mode, since the first electronic switch 7a and the second electronic switch 7b are set to the OFF state, the first conduction path is not formed in the first inner line 2a, and the second conduction path is not formed in the second inner line 2b. Accordingly, the first return current in the first inner line 2a becomes extremely small, and the second return current in the second inner line 2b becomes extremely small.

On the other hand, one end of the first outer line 3a is connected to the first grounding conductor 4a via the third connection conductor 6c, and the other end thereof is connected to the second grounding conductor 4b via the fourth connection conductor 6d. That is, a third conduction path in which a current can flow between one end and the other end of the first outer line 3a is formed in advance.

Accordingly, in the high-delay mode, a third return current flows from one end to the other end of the first outer line 3a due to the signal current in the signal line 1. The third return current has a reverse direction of the flowing direction of the signal current in the signal line 1. Accordingly, the third return current can decrease the inductance L1 of the signal line 1 due to electromagnetic coupling between the signal line 1 and the first outer line 3a.

One end of the second outer line 3b is connected to the first grounding conductor 4a via the fifth connection conductor 6e, and the other end thereof is connected to the second grounding conductor 4b via the sixth connection conductor 6f. That is, a fourth conduction path in which a current can flow between one end and the other end of the second outer line 3b is formed in advance.

Accordingly, in the high-delay mode, a fourth return current flows from one end to the other end of the second outer line 3b due to the signal current in the signal line 1. The fourth return current has a reverse direction of the flowing direction of the signal current in the signal line 1. Accordingly, the fourth return current can decrease the inductance L1 of the signal line 1 due to electromagnetic coupling between the signal line 1 and the second outer line 3b.

Here, a distance between the signal line 1 and each of the first outer line 3a and the second outer line 3b is larger than a distance between the signal line 1 and each of the first inner line 2a and the second inner line 2b. Accordingly, the third return current and the fourth return current operate less to decrease the inductance L1 than the first return current and the second return current operate. When a decrease of the inductance L1 due to the third return current and the fourth return current is defined as ΔLh, an effective inductance Lp of the signal line 1 is (L1−ΔLh).

On the other hand, the signal line 1 has the capacitance C1 which is a parasitic capacitance. In the high-delay mode, since the fourth electronic switch 7d is set to the ON state, the capacitor 5 is connected between the signal line 1 and the second grounding conductor 4b. That is, the signal line 1 has a capacitance Cb in which the capacitance Ca of the capacitor 5 and the capacitance C1 (the parasitic capacitance) are combined. Accordingly, the second propagation delay time $T_H$ proportional to $(Lp \times Cb)^{1/2}$ acts on the high-frequency signal S propagating in the signal line 1.

The high-frequency signal S at the output end (one end) of the signal line 1 has a phase which is delayed by the second phase difference $\theta_H$ from the high-frequency signal S at the input end of the signal line 1 due to the second propagation delay time $T_H$. That is, in the high-delay mode, since the inductance L1 of the signal line 1 decreases less to the inductance Lp due to the third return current and the fourth return current and the fourth electronic switch 7d is set to the ON state, the second phase difference $\theta_H$ greater than the first phase difference $\theta_L$ in the low-delay mode is realized.

In the high-delay mode, the third electronic switch 7c is set to the OFF state. That is, in the high-delay mode, the measure for intentionally increasing the loss of the signal line 1 is not performed. As a result, the loss on the high-frequency signal S in the high-delay mode is the same as the loss on the high-frequency signal S in the low-delay mode.

In the digital phase shift circuit A and the digital phase shifter B according to this embodiment, since the output circuit Y is provided in the rear stage of the basic phase shift circuits X and $X_1$ to $X_n$, the output load of the basic phase shift circuits X and $X_n$ becomes less than the input load and is changed to a real number. The output impedance of the basic phase shift circuits X and $X_n$ has a predetermined magnitude (an absolute value) and has an imaginal impedance, but the output impedance of the output circuit Y is less than the output impedance of the basic phase shift circuits X and $X_n$ and a real impedance.

That is, in the output circuit Y, the line width Wa of the output signal line 9 is set to be larger than the line width W of the signal line 1 in the basic phase shift circuits X and $X_n$, the output load of the basic phase shift circuits X and $X_n$ is less than the input load. In the output circuit Y, since the open stub 10 is provided in the output signal line 9, the output impedance (a complex impedance) of the basic phase shift circuit X is changed to a real number.

Accordingly, with the digital phase shift circuit A and the digital phase shifter B according to this embodiment, an output reflection coefficient can be decreased in comparison with the related art. That is, according to this embodiment, it is possible to provide a digital phase shift circuit A and a digital phase shifter B that can decrease an output reflection coefficient in comparison with the related art.

Since the output signal line 9 of the output circuit Y is formed in a conductive layer different from that of the signal line 1 of the basic phase shift circuits X and $X_n$, the output signal line 9 can be more easily increased in line width than the signal line 1. That is, the line width of the output signal line 9 can be set to be large without being limited by another line. Accordingly, according to this embodiment, it is possible to more easily decrease the output reflection coefficient.

In the digital phase shift circuit A and the digital phase shifter B according to this embodiment, the right and left sides and the bottom of the output signal line 9 are surrounded by the first to third individual grounding lines 11a to 11c (signal-line grounding lines). Accordingly, according to this embodiment, it is possible to effectively block electromagnetic waves radiated from the output signal line 9.

In the digital phase shift circuit A and the digital phase shifter B according to this embodiment, the right and left sides and the top and bottom of the open stub 10 are surrounded by the fourth to seventh individual grounding lines 11d to 11g (stub grounding lines). Accordingly, according to this embodiment, it is possible to effectively block electromagnetic waves radiated from the open stub 10.

In the digital phase shifter B according to this embodiment, since the open stub 10 is disposed between the rows of the "n" basic phase shift circuits $X_1$ to $X_n$ arranged in two rows (multiple rows), it is possible to effectively utilize a surplus space between the rows. Accordingly, according to this embodiment, it is possible to achieve a decrease in size of the digital phase shifter B.

Modified examples of the embodiment of the present invention are described below with reference to FIGS. 5A and 5B. In the following description, the same or equivalent elements as in the aforementioned embodiment are referred to by the same reference signs and description thereof are briefed or omitted.

Figure 5A:
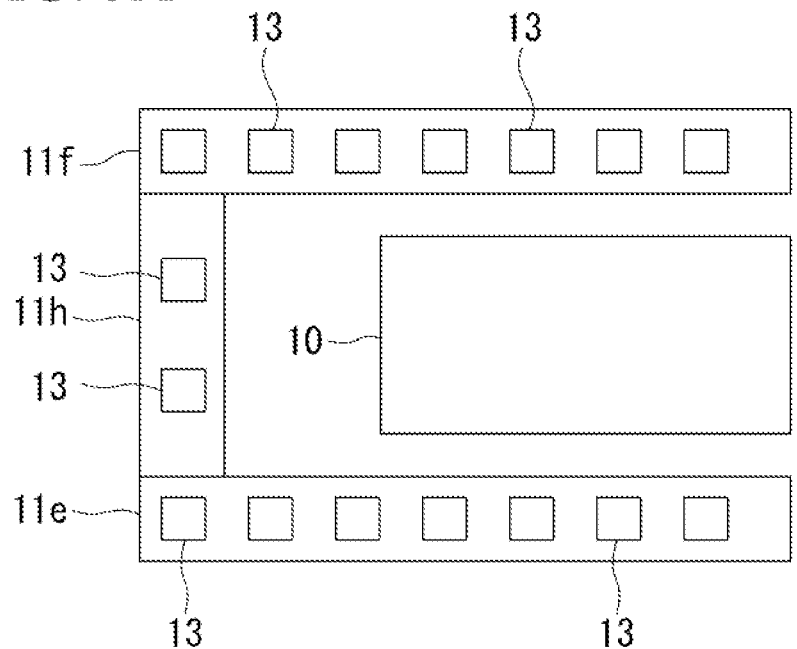
FIG. 5A is a front view illustrating a modified example of the digital phase shift circuit A according to the embodiment of the present invention.

FIG. 5A is a front view illustrating the open stub 10 and the output grounding line 11 in a modified example of the digital phase shift circuit A according to the embodiment of the present invention. FIG. 5B is a sectional view illustrating the open stub 10 and the output grounding line 11 in a modified example of the digital phase shift circuit A according to the embodiment of the present invention.

The output grounding line 11 according to a modified example includes individual grounding lines 11a to 11g similarly to the digital phase shift circuit according to the embodiment and additionally includes an eighth individual grounding line 11h (a stub grounding line).

In this modified example, the individual grounding lines 11d to 11g extend beyond the tip of the open stub 10 in the extending direction of the open stub 10. The eighth individual grounding line 11h extends in a direction perpendicular to the extending direction of the open stub 10 and is connected to the tips in the extending direction of the open stub 10 of the fifth individual grounding line 11e and the sixth individual grounding line 11f. The eighth individual grounding line 11h is connected to the tips in the extending direction of the open stub 10 of the fourth grounding line 11d and the seventh grounding line 11g through the grounding-lie vias 13.

Figure 5B:
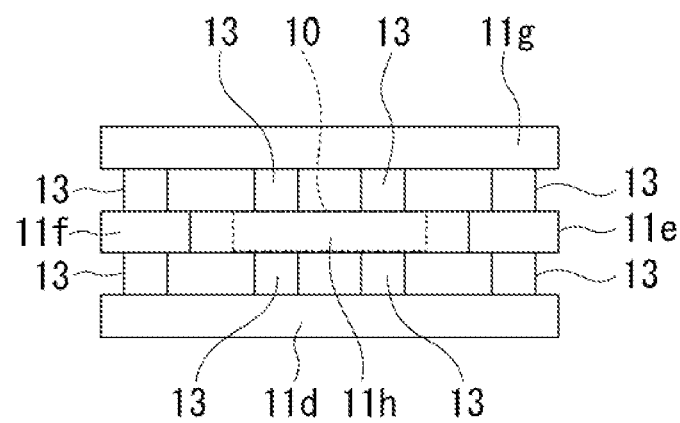
FIG. 5B is a sectional view illustrating a modified example of the digital phase shift circuit A according to the embodiment of the present invention.

The eighth individual grounding line 11h is a grounding line that covers the tip of the open stub 10 from one side thereof in the extending direction of the open stub 10 as illustrated in FIGS. 5A and 5B. That is, the eighth individual grounding line 11h is formed in the same layer as the open stub 10, that is, in the first conductive layer, and has a function of blocking electromagnetic waves radiated from the open stub 10 to the one side thereof in the extending direction.

In the digital phase shift circuit A and the digital phase shifter B according to the modified example of the embodiment, the right and left sides and the top and bottom of the open stub 10 are surrounded by the fourth to seventh individual grounding lines 11d to 11g, and the tip of the open stub 10 is surrounded by the eighth grounding line 11h from one side thereof in the extending direction of the open stub 10. Accordingly, according to the modified example of the embodiment, it is possible to more effectively block electromagnetic waves radiated from the open stub 10.

REFERENCE SIGNS LIST

A Digital phase shift circuit
B Digital phase shifter
X, $X_1$ to $X_n$, $X_{i-1}$, $X_i$, $X_{i+1}$ Basic phase shift circuit
Y Output circuit
Z1, Z2 Connection circuit
1 Signal line
2a First inner line
2b Second inner line
3a First outer line
3b Second outer line
4a First grounding conductor
4b Second grounding conductor
5 Capacitor
6a First connection conductor
6b Second connection conductor 6c Third connection conductor
6d Fourth connection conductor
6e Fifth connection conductor
6f Sixth connection conductor
6g Seventh connection conductor
7a First electronic switch
7b Second electronic switch
7c Third electronic switch
7d Fourth electronic switch (capacitor electronic switch)
8 Switch control portion
9 Output signal line
10 Open stub
11 Output grounding line
12 Signal-line via
13 Grounding-line via
14 First individual connection line
15a Second individual connection line
15b Third individual connection line
16a Fourth individual connection line
16b Fifth individual connection line
17 Sixth individual connection line
18a Seventh individual connection line
18b Eighth individual connection line
19a Ninth individual connection line
19b Tenth individual connection line

The invention claimed is:

1. A digital phase shift circuit comprising:
a basic phase shift circuit including a signal line, a pair of inner lines provided on both sides of the signal line, a pair of outer lines provided outside of the inner lines, a first grounding conductor connected to one ends of the pair of inner lines and the pair of outer lines, a second grounding conductor connected to the other ends of the pair of outer lines, and a pair of electronic switches, one of the pair of electronic switches being provided between the other end of one of the pair of inner lines and the second grounding conductor, and the other of the pair of electronic switches being provided between the other end of the other of the pair of inner lines and the second grounding conductor; and
an output circuit configured to decrease an output load of the basic phase shift circuit in comparison with an input load thereof.

2. The digital phase shift circuit according to claim 1, wherein the output circuit includes an output signal line that is connected to the signal line and has a larger line width than the signal line.

3. The digital phase shift circuit according to claim 2, wherein the output signal line is provided in a conductive layer different from a conductive layer in which the signal line is provided.

4. The digital phase shift circuit according to claim 3, wherein the output signal line is provided in the conductive layer above the conductive layer in which the signal line is provided,
wherein the output circuit includes a first output grounding line provided in the same conductive layer as the inner line and the outer line, and
wherein the first output grounding line is connected to the inner line and the outer line.

5. The digital phase shift circuit according to claim 2, wherein the output circuit includes a second output grounding line and a third output grounding line provided on both sides of the output signal line.

6. The digital phase shift circuit according to claim 2, wherein the output circuit includes an open stub connected to the output signal line.

7. The digital phase shift circuit according to claim 6, wherein the open stub is provided in the same conductive layer as the signal line.

8. The digital phase shift circuit according to claim 6, wherein the output circuit includes a stub grounding line provided to surround the open stub.

9. A digital phase shifter in which basic phase shift circuits are connected in a cascade manner of multiple stages in multiple rows, each of the basic phase shift circuits is the basic phase shift circuit of the digital phase shift circuit according to claim 6,
wherein the output circuit is provided to only the basic phase shift circuit located in a rearmost stage, and
wherein the open stub is provided between the rows of the basic phase shift circuits.

10. The digital phase shift circuit according to claim 1, wherein the basic phase shift circuit includes a capacitor of which one end is connected to the signal line and of which the other end is connected to at least one of the first grounding conductor and the second grounding conductor.

11. The digital phase shift circuit according to claim 10, wherein a capacitor electronic switch is provided between a lower electrode of the capacitor and at least one of the first grounding conductor and the second grounding conductor.

12. A digital phase shifter in which basic phase shift circuits are connected in a cascade manner of multiple stages, each of basic phase shift circuits is the basic phase shift circuit of the digital phase shift circuit according to claim 1,
wherein the output circuit is provided to only the basic phase shift circuit located in a rearmost stage.

13. The digital phase shift circuit according to claim 1, wherein the basic phase shift circuit includes a first inner-outer grounding line connecting one end of one inner line out of the pair of inner lines and one end of one outer line out of the pair of outer lines and a second inner-outer grounding line connecting one end of the other inner line out of the pair of inner lines and one end of the other outer line out of the pair of outer lines, and
wherein the first inner-outer grounding line and the second inner-outer grounding line are connected to the first grounding conductor through a via.

* * * * *